(12) United States Patent
Cheng et al.

(10) Patent No.: US 6,584,987 B1
(45) Date of Patent: Jul. 1, 2003

(54) METHOD FOR IMPROVED CLEANING IN HDP-CVD PROCESS WITH REDUCED $NF_3$ USAGE

(75) Inventors: Yi-Lung Cheng, Taipei (TW); Chun-Ching Tsan, Touliu (TW); Wen-Kung Cheng, Toufen (TW); Yin-Lang Wang, Tai-Chung (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 137 days.

(21) Appl. No.: 09/808,929

(22) Filed: Mar. 16, 2001

(51) Int. Cl.[7] ................................. B08B 7/04
(52) U.S. Cl. ................ 134/1.1; 134/22.18; 134/30; 438/905
(58) Field of Search .................... 134/1, 1.1, 22.1, 134/22.18, 26, 30, 19; 438/905

(56) References Cited

U.S. PATENT DOCUMENTS

| | | | |
|---|---|---|---|
| 5,620,526 A | * 4/1997 | Watatani et al. | 134/1.1 |
| 5,756,400 A | 5/1998 | Ye et al. | 438/710 |
| 5,811,356 A | 9/1998 | Murugesh et al. | 438/711 |
| 5,843,239 A | 12/1998 | Shrotriya | 134/1.1 |
| 5,849,092 A | 12/1998 | Xi et al. | 134/1.1 |
| 5,861,065 A | * 1/1999 | Johnson | 134/2 |
| 5,911,833 A | 6/1999 | Denison et al. | 134/1.1 |
| 5,926,743 A | 7/1999 | Xi et al. | 438/905 |
| 6,060,397 A | * 5/2000 | Seamons et al. | 134/1.1 |
| 6,082,375 A | * 7/2000 | Gealy et al. | 134/1.1 |
| 6,255,222 B1 | * 7/2001 | Xia et al. | 134/1.1 |

* cited by examiner

Primary Examiner—Alexander Markoff
(74) Attorney, Agent, or Firm—George O. Saile; Stephen B. Ackerman; Stephen G. Stanton

(57) ABSTRACT

A method for cleaning residual material from a chemical vapor deposition (CVD) apparatus in situ employing dry etching. There is first employed a high density plasma chemical vapor deposition (HDP-CVD) method to deposit layers of silicon oxide material upon substrates within a chemical vapor deposition reactor apparatus. After removal of substrates, the reactor chamber is closed off. The interior of the reactor is then filled with a gas and a plasma formed therewithin, to which oxygen is added and the reactor allowed to come to an increased temperature and bake for a period of time. The reactor power is then turned off and the reactor evacuated. There is then carried out a normal cleaning step within the reactor chamber employing a reactive gas such as $NF_3$, with greater cleaning efficiency due to the increased temperature caused by the baking step.

9 Claims, 5 Drawing Sheets

METHOD FOR IMPROVED CLEANING IN HDP-CVD PROCESS WITH REDUCED NF$_3$ USAGE

BACKGROUND OF THE INVENTION

1. Field of the Invention

The present invention relates to the field of microelectronics fabrication. More specifically, the present invention relates to the forming of layers of microelectronics materials employing the method of high density plasma chemical vapor deposition.

2. Description of the Related Art

In the fabrication of microelectronics devices, there is considerable employment of layers of microelectronics materials sequentially formed and often thereafter patterned upon substrates. As microelectronics device dimensions have shrunk and microelectronics fabrications have increased in size and circuit density, the necessity for material layers to approach freedom from defects has placed great emphasis on ultra-clean methods and apparatus for fabrication of such layers.

A common method of formation of microelectronics layers is chemical vapor deposition (CVD), in which a reactive gas or gases are combined within a reactor vessel to form a solid layer deposited upon a substrate surface, with or without employing other sources of energy in addition to the chemical free energy of the reactants. When additional energy is supplied in the form of a high-density electrical plasma sustained in the reactive gases, the process is commonly referred to as a high density plasma chemical vapor deposition (HDP-CVD) process. In addition to forming a layer upon the desired substrate surface, the material formed by the chemical reaction also deposits on other interior surfaces of the reactor and associated apparatus. This residual material tends to build up as the number of deposition runs increases, and eventually must be removed or else problems may arise due to the surface deposit flaking off, releasing undesired substances into the reactor vessel during a deposition. Defects within the microelectronics fabrication and other undesirable consequences are liable to result.

The equipment employed within chemical vapor deposition processes may be cleaned by periodic disassembly and employing wet or dry cleaning methods upon the individual sub-components of the reactor system, but this results in significant down time and loss of production, increasing the cost of fabrication. More recently, dry etch cleaning has been introduced, in which the reactor system is kept in operation and periodically an etching gas is introduced which serves to clean the system in situ. This operation requires far less time and hence is less costly than wet or manual cleaning. Although dry etch cleaning of CVD systems is in general satisfactory, this method is also not without problems.

For example, the dry etching gas or gases must be carefully selected to avoid themselves or their products being the source of additional residual contamination. It is necessary to select dry etching gases which will not corrode or otherwise damage the apparatus. Also, the cost of the etching gas or gases may be a significant added factor if large quantities are needed.

It is thus towards the goal of providing a method for dry etch cleaning of CVD systems that the present invention is generally directed.

Various methods have been disclosed for the purpose of cleaning systems employed in chemical vapor deposition.

For example, Ye et al., in U.S. Pat. No. 5,756,400, disclose a method for plasma cleaning the interior surfaces of semiconductor processing chambers without chamber down time or significant loss of semiconductor wafer production. The method employs intermittent use of cleaning steps in a plasma reactor, employing a mixture of halogen-containing cleaning gases. The mixture of gases comprises one-half or more of a fluorine-containing gas and one-half or less of a chlorine-containing gas.

Further, Murugesh et al., in U.S. Pat. No. 5,811,356, disclose a method for reducing the mobile ion and metal contaminants in a semiconductor processing chamber. The method employs a fluorinated gas activated by RF power in the processing chamber in a cleaning step, followed by a seasoning step which forms over the cleaned interior surfaces a thin layer of the material to be subsequently deposited on wafers.

Still further, Shrotriya, in U.S. Pat. No. 5,843,239, disclose a method for removing particles from the interior of a processing chamber which improves the quality of the wafers subsequently produced in the chamber. The method employs a two-step cleaning process in which a first cleaning gas is introduced into the chamber to remove particles. A second cleaning gas is then introduced to remove a residue formed by the reaction of the first cleaning gas with the interior of the chamber.

Yet still further, Xi et al., in U.S. Pat. No. 5,849,092 and U. S. Pat. No. 5,926,743, disclose a method and an apparatus for removing particles and residues from a substrate processing system without over-etching the system. The method employs chlorine trifluoride as an etching gas, and the temperature of various parts of the system adjusted to control the cleaning rate and minimize over-etching of the cooler regions of the system.

Finally, Denison et al., in U.S. Pat. No. 5,911,833, disclose a method for cleaning a semiconductor wafer chuck in situ within a processing chamber while maintaining the system in a sealed condition and minimizing the time required for chuck cleaning. The method employs a cleaning gas and RF power introduced into the chamber containing the wafer chuck to perform the cleaning operation without disrupting the sealed condition of the chamber.

Desirable in the art of microelectronics fabrications are additional methods for cleaning reactor systems employed in chemical vapor deposition (CVD) with reduced cost and increased efficiency of cleaning.

It is towards this goal that the present invention is generally and more specifically directed.

SUMMARY OF THE INVENTION

A first object of the present invention is to provide a method for cleaning of residual material from a chemical vapor deposition apparatus in situ.

A second object of the present invention is to provide a method in accord with the first object of the present invention where the cleaning of a high density plasma chemical vapor deposition system is performed in situ employing a dry etching reaction to remove the residual material.

A third object of the present invention is to provide a method in accord with the first object of the present invention and the second object of the present invention where the method is readily commercially implemented.

In accord with the objects of the present invention, there is provided a method for dry etching of residual deposits in situ from a chemical vapor deposition (CVD) apparatus. To practice the invention, there is first employed a high density plasma chemical vapor deposition (HDP-CVD) apparatus to form layers of silicon oxide on substrates. After removal of substrates, the reactor is closed off. The interior of the reactor is then filled with a gas and a plasma formed, after which oxygen is added and the reactor allowed to bake to an increased temperature for a period of time. The power is then turned off and the reactor evacuated. There is then followed a normal cleaning step employing a reactive gas such as $NF_3$, with greater cleaning efficiency due to the increased temperature caused by the bake step.

The present invention employs materials and methods which are known in the art of microelectronics fabrication, but in a novel order and sequence. The method of the present invention is therefore readily commercially implemented.

BRIEF DESCRIPTION OF THE DRAWINGS

The objects, features and advantages of the present invention are understood within the context of the Description of the Preferred Embodiment, as set forth below. The description of the Preferred Embodiment is understood within the context of the accompanying drawings, which form a material part of this disclosure, wherein:

FIG. 3 illustrates the effect of baking time on temperature of the reactor; FIG. 4 illustrates the effect of baking time on the cleaning rate; FIG. 5 illustrates the effect of $NF_3$ flow rate on cleaning rate; FIG. 6 illustrates the effect of $NF_3$ concentration on cleaning rate; and FIG. 7 illustrates the effect of total gas pressure on the cleaning rate.

DESCRIPTION OF THE PREFERRED EMBODIMENT

Figure 1:
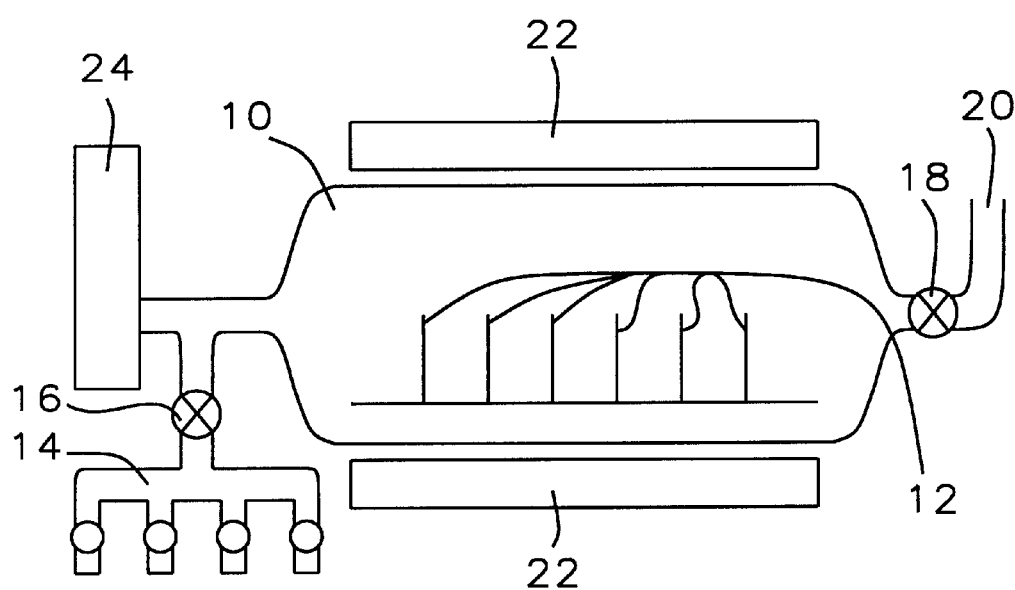
FIG. 1 is a schematic cross-sectional diagram of a chemical vapor deposition apparatus.

The present invention provides a method for cleaning a chemical vapor deposition reactor system in situ with greater efficiency of cleaning and reduced cost. Referring now to FIG. 1, there is shown a schematic cross-sectional diagram of an apparatus for chemical vapor deposition (CVI) of layers of material employed within microelectronics fabrications. In accord with a general embodiment of the present invention, the CVD apparatus whose schematic cross-sectional diagram is shown in FIG. 1 may be cleaned in situ.

Shown in FIG. 1 is a reactor vessel 10 within which is placed the substrates 12 upon which the microelectronics layer is to be formed. The microelectronics layer is formed from the reaction of gases supplied from the manifold 14 with valves for admission 16 and shutoff 18 of the reactor. The system may also be evacuated by vacuum system 20 after use or purging. Plasma may be initiated and sustained within the gases in the reactor by means of the power electrodes 22. Temperature, pressure and flow rate controls 24 are employed for process monitoring and control.

Figure 2:
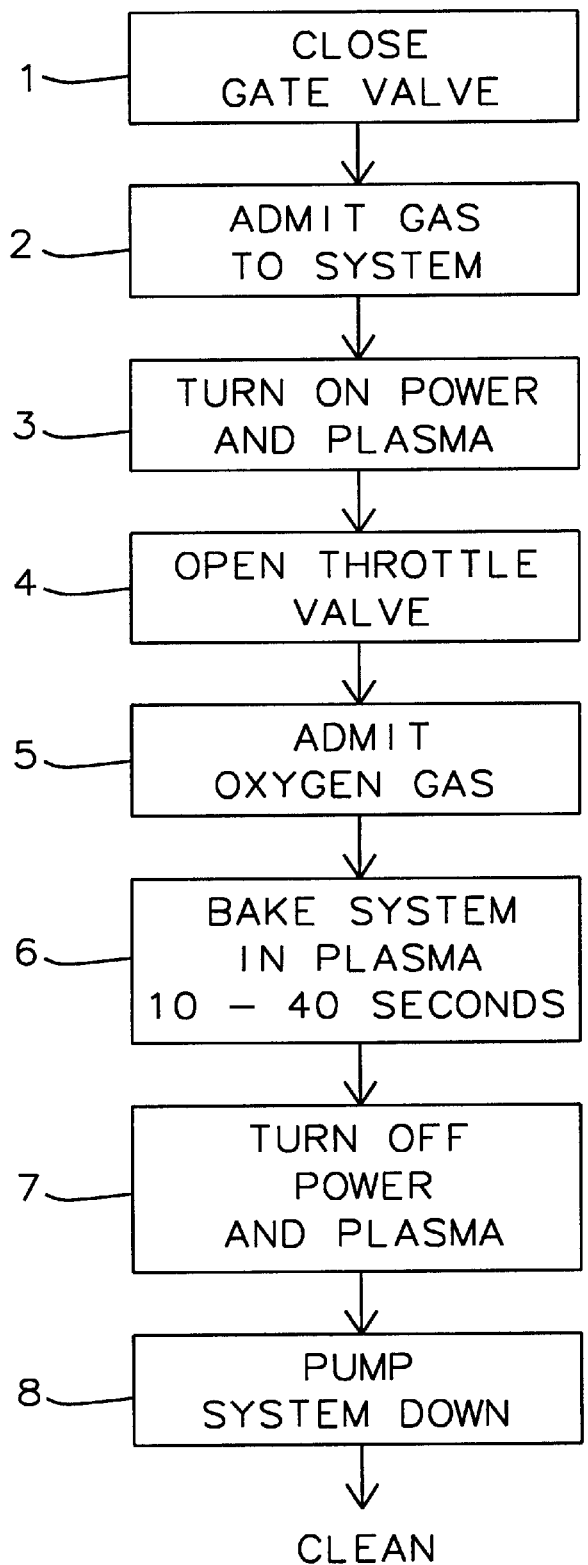
FIG. 2 is a flow chart diagram of the process of the present invention.

Referring now more particularly to FIG. 2, there is shown a process flow chart for the method of the present invention. FIG. 2 illustrates the step-wise process flow of the present invention: (1) Close gate valve to system; (2) Admit gas to pressurize system; (3) Turn on microwave power and initiate plasma; (4) Open throttle valve; (5) Admit oxygen gas; (6) Bake system in plasma 10–20 seconds; (7) Turn off microwave power and plasma; (8) Plump system down. The system is thus heated by the plasma and is then cleaned in accord with standard procedure employing nitrogen trifluoride ($NF_3$) gas activated by microwave power.

With respect to the gas employed to sustain the plasma initiated by the microwave power source, the gas may be argon or a mixture of argon and perfluorinated hydrocarbon vapors, such as, for example, tetrafluoromethane ($CF_4$), hexafluoroethane ($C_2F_6$) or mixtures of any or all of these.

With respect to the cleaning procedure employing $NF_3$ gas and microwave power, the effect of pre-heating the system in accord with the present invention is to increase the efficiency of the cleaning process, so that lesser quantities of reactive gas and power are employed. In addition, cleaning may be performed with significantly lesser quantities of particulate matter being formed.

The present invention provides a method for cleaning of a chemical vapor deposition (CVD) reactor chamber in situ with increased efficiency leading to reduced usage of cleaning gas, higher yield and greater throughput of wafer production.

Experimental

The benefits and advantages of the present invention are exemplified by the experimental results obtained upon applying the method of the present invention to semiconductor substrates and examining the amount of particulate and residual materials resulting from variation in operating parameters. Experiments were performed employing systematic variation of the procedure whose process flow chart is illustrated in FIG. 2. Silicon semiconductor wafers were employed as substrates upon which were formed layers of silicon oxide. The silicon substrates were transferred into the reactor vessel prior to employing a variation on the process flow described in FIG. 2. After completion of the process flow, the silicon substrates were removed from the reactor vessel and the residual silicon oxide thickness and surface particle count measured. The cleaning rate was determined from the decrease in silicon oxide thickness. The residual layer thicknesses after a particular set of experimental variables were employed was determined by ellipsometric methods as are known in the art of silicon substrate fabrication. The concentration of surface particulate matter was determined by surface particle scanning methods, employing, for example, particle scanning counters known in the art of semiconductor technology manufactured by Tencor, KLA, and other vendors The percentage of yield loss was determined by measuring particular substrate parameters for an experimental set of substrates compared to substrates processed in standard fashion, employing the standard process group as controls with a normalized yield of 100%.

Figure 3:
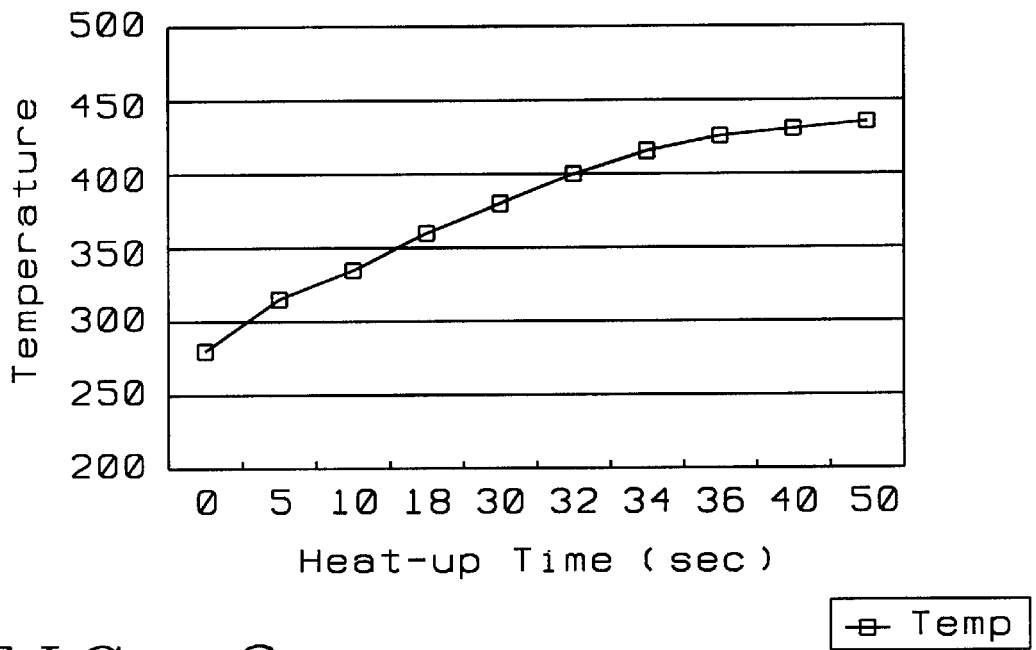
FIG. 3, FIG. 4, FIG. 5, FIG. 6 and FIG. 7 are graphs illustrating the effects of various parameters on the temperature and cleaning rate of the reactor, and on the yield of substrates.

The effect of baking time on the temperature of the reactor chamber is illustrated in FIG. 3. The temperature of the reactor was determined employing a calibrated thermocouple probe as a wafer temperature monitor (WTM as a function of bake or heat-up time. The results illustrate that the temperature approaches a constant value after about 30 seconds of bake time.

Figure 4:
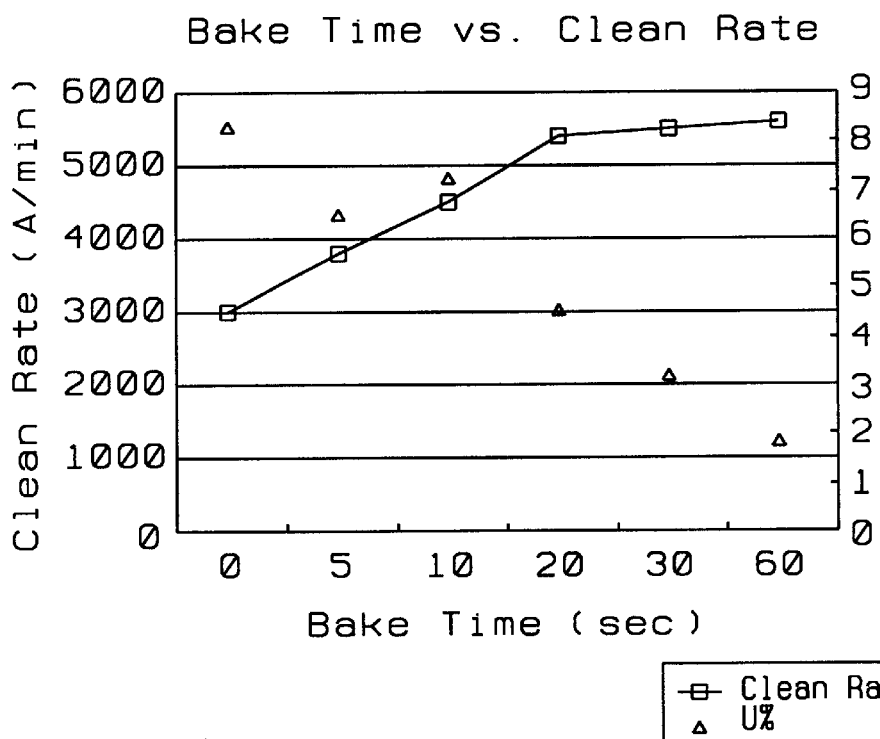

The effect of bake time within the reactor on the subsequent cleaning rate of the deposit within the reactor vessel is illustrated in FIG. 4. The cleaning rate increases with bake time, and hence temperature, up to about 20 seconds, after which the cleaning rate remains constant. Also shown in FIG. 4 is the effect of the bake time on the percent yield loss due to being outside the specification for cleaning showing that the yield loss decreases as the cleaning rate approaches a constant value.

Figure 5:
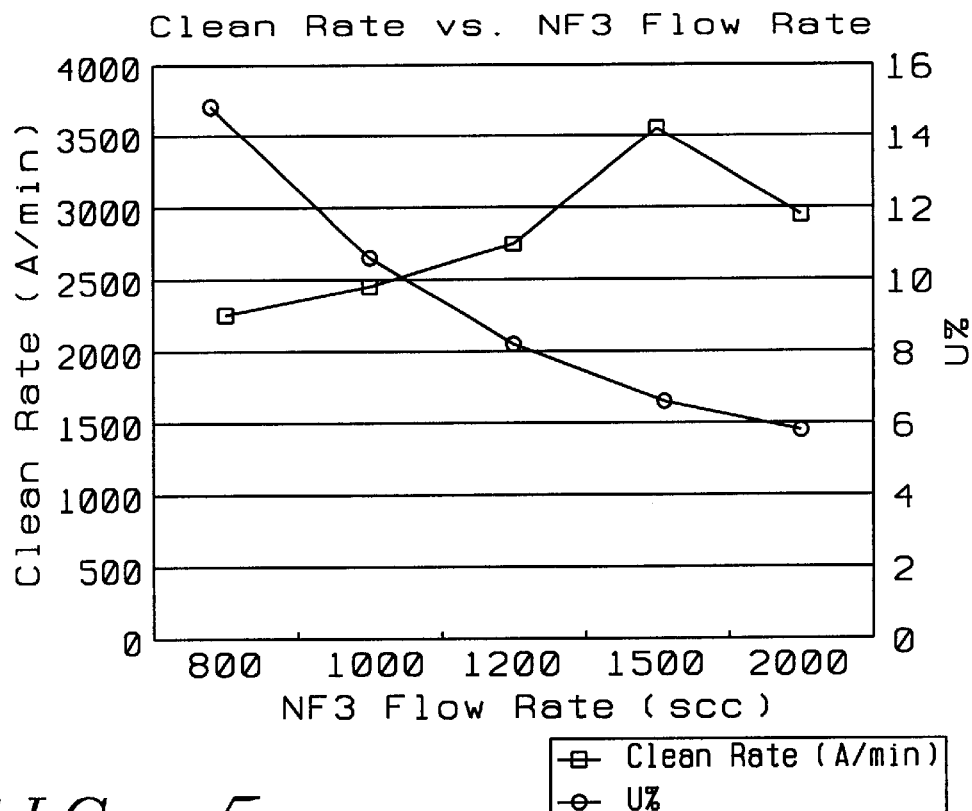
Figure 6:
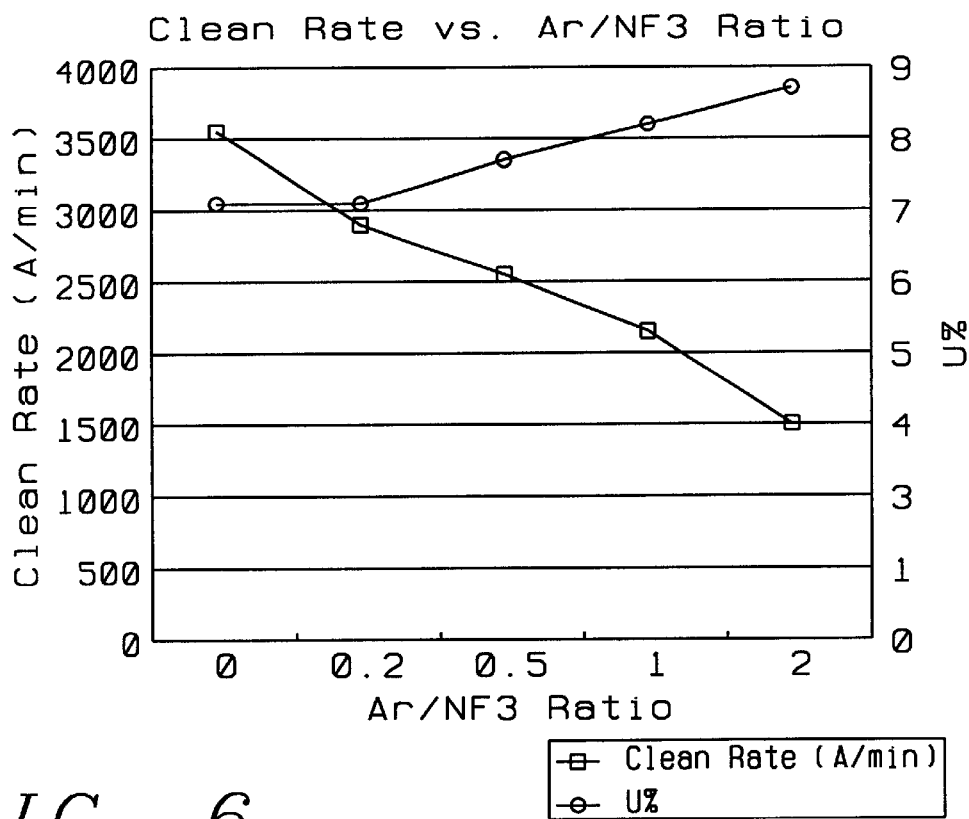

The effect of nitrogen trifluoride ($NF_3$) gas flow on the cleaning rate is shown in FIG. 5 and FIG. 6, which show the cleaning rate versus $NF_3$ gas flow rate and argon/$NF_3$ gas flow ratio respectively. The cleaning rate increases slightly with $NF_3$ gas flow rate and the yield loss decreases (FIG. 5), but the cleaning rate decreases with a slight increases in yield loss as the amount of $NF_3$ gas in the total gas mixture decreases.

Figure 7:
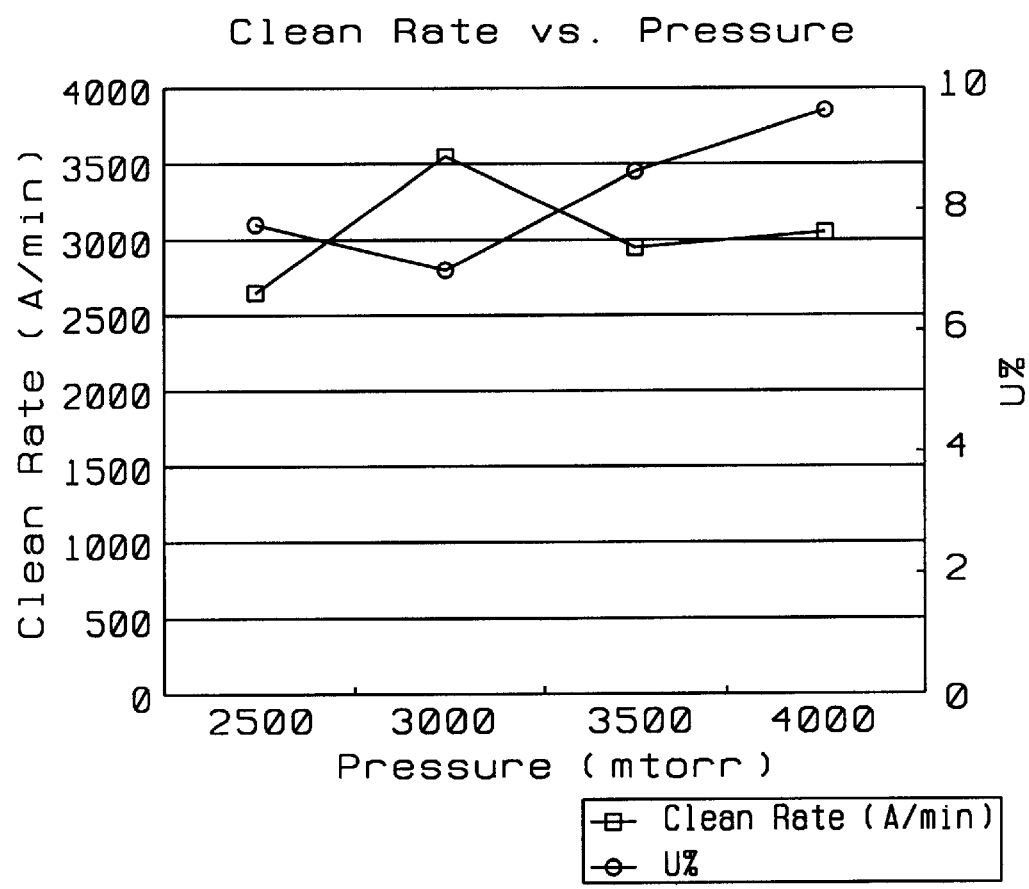

FIG. 7 illustrates the dependence of cleaning rate and yield on total gas pressure within the reactor. Neither parameter is dependent on the total gas pressure.

The experimental results have shown that the temperature of the reactor is increased by the sustaining of a plasma within the reactor vessel for a period of time, and that the subsequent cleaning rate by $NF_3$ is enhanced by the increased temperature; likewise the subsequent yield is increased due to the increased temperature.

As is understood by a person skilled in the art, the general embodiment of the present invention is illustrative of the present invention rather than limiting of the present invention. Revisions and modifications may be made to materials, dimensions and structures providing useful embodiments of the present invention while remaining within the spirit and scope of the present invention as defined by the appended claims.

What is claimed is:

1. A method for cleaning a chamber comprising the sequential steps of:

providing a chamber employed in chemical vapor deposition; said chamber having a first temperature;

evacuating said chamber;

admitting to said chamber a gas or gases comprising Argon, perfluorinated hydrocarbons or mixtures thereof;

sustaining a plasma in said gas in said chamber;

admitting oxygen gas to said chamber;

maintaining said plasma in said chamber to elevate the first temperature of said chamber to a second temperature;

baking said chamber containing said plasma at said second temperature for a period of time;

turning off the power and causing a cessation of said plasma;

evacuating said chamber; and admitting a reactive cleaning gas including $NF_3$ to clean said chamber.

2. The method of claim 1 wherein said chamber is employed in chemical vapor deposition of layers of silicon oxide dielectric material.

3. The method of claim 1 wherein said plasma is formed and maintained employing microwave power.

4. The method of claim 1 wherein said period of bake time at said second temperature is greater than about 30 seconds.

5. The method of claim 1 wherein said reactive cleaning gas is a mixture of nitrogen trifluoride and argon gases.

6. A method for cleaning of residual material from a chemical vapor deposition apparatus in sits comprising the sequential steps of:

providing a high density plasma chemical vapor deposition (HDP-CVD) chamber apparatus employed to form layers of silicon oxide dielectric material on substrates held therein; said chamber having a first temperature;

removing said substrates and closing off said chamber; said chamber having a first temperature;

filling said chamber with a gas or gas mixture comprising Argon, tetrafluoromethane, hexafluoroethane or mixtures thereof;

forming a plasma within the chamber to cause elevation of said first chamber apparatus temperature to a second temperature;

adding oxygen gas to the chamber while sustaining said plasma and allowing said chamber to bake at said second temperature for a period of time;

turning off power to the chamber to terminate the plasma, and evacuating the chamber; and admitting a reactive cleaning gas including $NF_3$ to clean the chamber.

7. The method of claim 6 wherein the plasma is formed and sustained employing microwave power.

8. The method of claim 6 wherein the reactive cleaning gas is a mixture of nitrogen trifluoride ($NF_3$) and argon gases.

9. The method of claim 6 wherein the bake time at said second temperature is greater than about 30 seconds.

* * * * *